United States Patent [19]
Tani

[11] Patent Number: 5,677,856
[45] Date of Patent: Oct. 14, 1997

[54] SIMULATION APPARATUS FOR CIRCUIT VERIFICATION

[75] Inventor: Takahiro Tani, Hyogo, Japan

[73] Assignees: Mitsubishi Electric Semiconductor Software Corporation, Itami; Mitsubishi Denki Kabushiki Kaisha, Tokyo, both of Japan

[21] Appl. No.: 492,793

[22] Filed: Jun. 20, 1995

[30] Foreign Application Priority Data

Sep. 2, 1994 [JP] Japan .................................. 6-210222

[51] Int. Cl.$^6$ ...................................... G06F 17/50
[52] U.S. Cl. ............................ 364/578; 364/488; 364/489
[58] Field of Search ................................ 364/578, 488, 364/489

[56] References Cited

U.S. PATENT DOCUMENTS

| | | | |
|---|---|---|---|
| 5,446,676 | 8/1995 | Huang et al. | 364/578 |
| 5,559,715 | 9/1996 | Misheloff | 364/488 |
| 5,581,475 | 12/1996 | Majors | 364/488 |

*Primary Examiner*—Vincent N. Trans
*Attorney, Agent, or Firm*—Oblon, Spivak, McClelland, Maier & Neustadt, P.C.

[57] ABSTRACT

The temperature of the circuit to be verified is evaluated. A simulation executing section (101) executes logic simulation of the circuit to be verified expressed in function block units at function block level. A circuit action extracting section (103) extracts an actin mode of a function block in its process. A total current consumption calculating section (105) calculates the total current consumption which is the current consumed in the entire circuit to be verified, on the basis of the data of current consumption in each action mode and extracted action mode. An average current calculating section (107) calculates the average current which is the average of the total current consumption over the check period, reflecting the thermal characteristic of the circuit to be verified. An allowable temperature judging section (109) calculates the temperature of the circuit to be verified according to this average current, and compares with an allowable current. An error message output section (110) issues a message when the temperature exceeds the allowable temperature. The temperature can be evaluated, therefore, by using logic simulation. (FIG. 1)

15 Claims, 13 Drawing Sheets

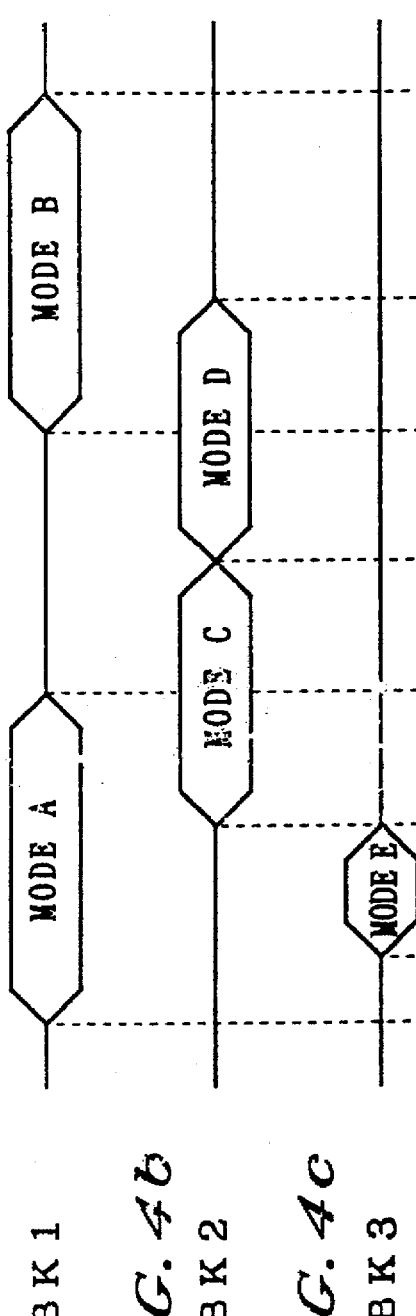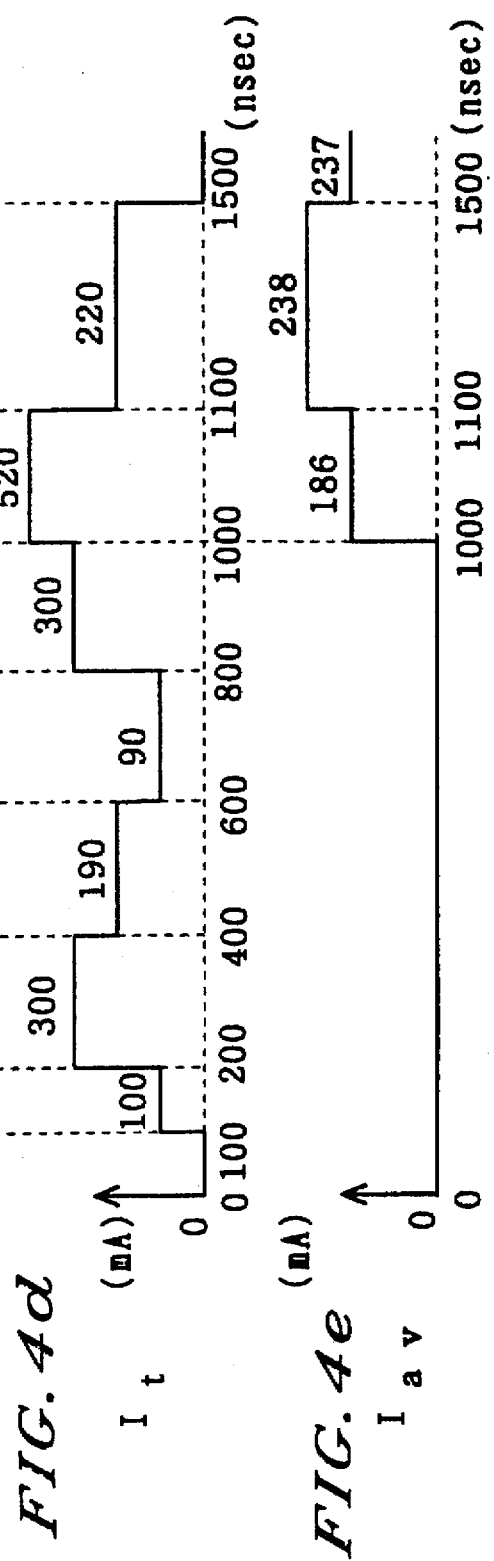
FIG. 4a BK1
FIG. 4b BK2
FIG. 4c BK3
FIG. 4d $I_t$
FIG. 4e $I_{av}$ $I_1$ $I_2$ $I_t$ $I_{av}$

TIME 2000   2100      2500   2650   nsec

SIMULATION APPARATUS FOR CIRCUIT VERIFICATION

BACKGROUND OF THE INVENTION

1. Field of the Invention

The present invention relates to a simulation apparatus for circuit verification capable of evaluating the temperature of the circuit to be verified.

2. Description of the Background Art

In circuit designing of LSI (large-scale integration) or the like, simulation, or the technique of building up a model of the circuit to be verified on a computer and simulating its action is utilized as useful means for verifying the design prior to assembly of actual machine. As representative examples of such simulation technique for circuit verification, logic simulation and circuit simulation are hitherto known.

Logic simulation is to simulate the action according to the logic operation function of each circuit element for composing a digital circuit, and verify the logic operation action of the digital circuit. On the other hand, circuit simulation is to simulate the action of each circuit element in consideration of structure and characteristics of circuit elements such as size (for example, channel width and channel length of MOS transistor), and verify the circuit action, including analog action such as transient action. Each has its own features, and in the circuit designing field, by utilizing the both properly depending on the purpose, the circuit action is verified.

FIG. 12 is a block diagram showing the construction of a conventional logic simulation apparatus. This apparatus is designed to verify a digital circuit, and its action is simulated at logic gate element level. In FIG. 12, in a circuit connection data store 12, information about constitution of the circuit to be verified composed of logic gate elements as constituent units, that is, the circuit connection data is preliminarily stored. The circuit connection data describes the type of logic gate elements for composing the circuit to be verified, and their connection state. A simulation executing section 1 executes logic simulation on the circuit to be verified expressed by the circuit connection data, on the basis of the input test pattern signals stored in an input test pattern store 2.

Furthermore, in a signal name store 4, output signal names of logic gate elements for composing the circuit to be verified are stored. A circuit action extracting section 3 extracts a signal value of an output signal corresponding to an output signal name stored in the signal name store 4, in a process of execution of logic simulation by the simulation executing section 1.

In a gate current consumption data store 6, information about current consumption in each logic gate for composing the circuit to be verified is stored. This information is calculated in a gate current consumption calculating section 7, and is stored in the gate current consumption data store 6. The gate current consumption calculating section 7 calculates the current consumption during action of each logic gate element by, for example, executing circuit simulation.

A total current consumption calculating section 5 calculates the current consumption of each logic gate element corresponding to the signal value extracted by the circuit action extracting section 3 on the basis of the information about current consumption of every logic gate element stored in the gate current consumption data store 6, and also calculates the total current consumption, or the sum of current consumption over the entire circuit to be verified. The calculated amount of total current consumption is saved together with the previously calculated value of total current consumption. That is, in the total current consumption calculating section 5, the information about history of total current consumption is saved.

Incidentally, the circuit connection data store 12, input test pattern store 2, signal name store 4, and gate current consumption data store 6 are all memory media such as magnetic disk and semiconductor memory, and circuit connection data and other information are stored in a form of magnetic signals or electric signals.

An allowable current consumption judging section 8 judges if the value of the total current consumption calculated in the total current consumption calculating section 5 settles within a predetermined value of allowable current consumption or not. An error message output section 9 issues an error message to a CRT (cathode-ray tube display device) or list when the total current consumption exceeds the allowable current consumption as a result of judging by the allowable current consumption judging section 8. The error message includes the identifier of the logic gate element in action, its current consumption, total current consumption and other information.

An average current calculating section 10 calculates the average current, or the average of total current consumption over the logic simulation executing time. A list output section 11 lists up a graph showing the time course changes of total current consumption, or the average current calculated in the average current calculating section 10.

The simulation executing section 1 advances logic simulation step by step according to the input test pattern signal. When the present time is the simulation end time designated before, the simulation executing section 1 terminates simulation. On the other hand, the present simulation time is before the simulation end time, the logic simulation is advanced to the time of occurrence of next signal value change (event), that is, next simulation time. In this way, the logic simulation and accompanying action of calculation of total current consumption are advanced step by step.

The action of this logic simulation apparatus is explained below by referring to an example of the circuit to be verified shown in a circuit diagram in FIG. 13. The circuit to be verified in FIG. 13 is composed of a NAND gate element 18 and an inverter gate element 19 connected mutually in cascade. An output wire 20 of the NAND gate element 18 is connected to an input terminal of the inverter gate element 19, and an output wire 21 is connected to an output terminal of the inverter gate element 19.

In the circuit connection data store 12, the information about constitution of this circuit to be verified, that is, the information about the NAND gate element 18, inverter gate element 19, and their connection state is stored. In the input test pattern store 2, the test pattern of input signal to be entered in the input wire of the NAND gate element 18 is stored. In the signal name store 4, the signal names corresponding to the output wires 20 and 21 are stored. In the gate current consumption calculating section 7, the current consumptions due to action are calculated individually for the NAND gate element 18 and inverter gate element 19, and stored in the gate current consumption data store 6. Thus, after the specified information is stored in the stores 12, 2, 4, 6, the logic simulation and the accompanying processing of each section are repeatedly executed in every simulation time.

The circuit action extracting section 3 extracts the signal values of the output wire 20 and output wire 21 in each simulation time. Under the condition that the NAND gate element 18 and inverter gate element 19 are composed of CMOS transistors, in particular, the change of signal value in the output wires 20 and 21 is extracted. This because, in the logic gate element composed of CMOS transistors, the action period for consuming current corresponds to the transition period in which the output signal changes. For example, at a certain simulation time, when the output wire 20 changes from the signal value of low level (hereinafter called "L") to the signal value of high level (hereinafter called "H"), the change is extracted, and moreover the accompanying change of the output wire 21 from signal value "H" to "L" is extracted.

Next, the total current consumption calculating section 5 extracts the current consumption of the NAND gate element 18 which is the element for driving the output wire 20, and the current consumption of the inverter gate element 19 which is the element for driving the output wire 21, from the information stored in the gate current consumption data store 6. The total current consumption calculating section 5 further calculates their sum or the total current consumption, and saves its history.

At this simulation time, if the total current consumption exceeds the allowable current consumption, an error message is issued by the function of the allowable current consumption judging section 8 and error message output section 9. The error message includes the identifiers of logic gate elements active at this simulation time, that is, the NAND gate element 18 and inverter gate element 19, their current consumption, and total current consumption in the circuit to be verified.

When operation of each device on this simulation time is over, the simulation executing section 1 advances logic simulation to next simulation time. In this way, until reaching the simulation end time, logic simulation and operation of each device are executed in each simulation time. When reaching the simulation end time, by the function of the average current calculating section 10 and list output section 11, the average current or the average of total current consumption over the whole simulation period is listed out.

Thus, in the conventional logic simulation apparatus, it is possible to verify if the momentary total current consumption exceeds the specified reference value of allowable current consumption or not. However, the transistor elements for composing the logic gate elements are limited in temperature related with the accumulation quantity of total current consumption for a specific period.

When the temperature of the transistor element exceeds the limit known as allowable temperature, the transistor element can no longer act normally. For example, in the MOS transistor, as the threshold voltage is lowered excessively, it is no longer turned off by the specified gate voltage signal. Such abnormal action cannot be evaluated only with the momentary magnitude of current consumption. This is because the temperature is determined by the magnitude of loss heat accumulated in a certain period related with thermal characteristics of the circuit to be verified, such as thermal resistance and thermal capacity.

Accordingly, in the conventional logic simulation apparatus, it was the problem that it was impossible to verify whether the temperature rise exceeding the allowable temperature of the circuit to be verified that may led to malfunction of the logic gate element may occur or not. The problem same in the conventional circuit simulation apparatus.

SUMMARY OF THE INVENTION

According to a first aspect of the invention, a simulation apparatus for circuit verification comprises simulation executing means for building up a model equivalent to a circuit to be verified on a computer, operating the model on the computer by feeding an input test signal to be fed in the circuit to be verified equivalently to the model on the computer, and thereby simulating the action of the circuit to be verified, circuit action extracting means for extracting a signal relating with current consumption of each part of the circuit to be verified in the process of mimic action of the circuit to be verified by the simulation executing means, total current consumption calculating means for calculating and saving the total current consumption as the sum of current consumption over the entire circuit to be verified on the basis of the signal extracted by the circuit action extracting circuit; and temperature calculating means for calculating the temperature of the circuit to be verified on the basis of the history of total current consumption saved in the total current consumption calculating means.

In the apparatus of the first aspect of the invention, in the process of simulation on the computer, a signal relating to the current consumption in the circuit to be verified is extracted, and the total current consumption is calculated on the basis of this signal, and moreover the temperature of the circuit to be verified is calculated on the basis of the history of the total current consumption. By thus executing the simulation, information is obtained about the temperature which is the quantity depending on the past history of the total current consumption. Accordingly, for example, by comparing the obtained temperature with an allowable temperature, it can be verified before assembling the actual device whether the circuit to be verified may exceed the allowable temperature during operation or not.

A simulation apparatus for circuit verification in a second aspect of the invention further comprises temperature comparing means for comparing the temperature of the circuit to be verified calculated by the temperature calculating means with the allowable temperature in the circuit to be verified, and judging if the temperature of the circuit to be verified is below the allowable temperature or not, and output means for issuing the result judged by the temperature comparing means.

In the apparatus of the second aspect of the invention, the calculated temperature is judged to be lower than the allowable temperature or not, and the result is outputted, and it is possible to recognized directly whether the temperature of the circuit to be verified during action settles within the allowable temperature or not. That is, the reply if there is any risk that the circuit to be verified may fall in trouble due to temperature rise during action is obtained directly.

Preferably in the second aspect of the invention, the allowable temperature is determined as an upper limit temperature capable of guaranteeing normal action of circuit elements composing the circuit to be verified.

Further preferably in the second aspect of the invention, the circuit elements are MOS transistors, and the allowable temperature is determined as an upper limit of temperature capable of sufficiently turning off the MOS transistors by a specific gate voltage signal.

According to a third aspect of the invention, a simulation apparatus for circuit verification further comprises average current calculating means for calculating the average over a specific period of the total current consumption saved in the total current calculating means as average current, wherein the temperature calculating means calculates the temperature of the circuit to be verified as the sum of peripheral temperature of the circuit to be verified and product of the average current, supply voltage applied to the circuit to be verified, and thermal resistances of the circuit to be verified.

In the apparatus according to the third aspect of the invention, the average current or the average of the total current consumption for a specific period is once calculated, and the temperature depending on the history of the total current consumption is calculated on the basis of the average current, so that the temperature may be evaluated easily and promptly.

Preferably in the third aspect of the invention, the specific period is determined by executing simulation about thermal behavior of the circuit to be verified.

More preferably in the third aspect of the invention, the specific period is determined approximately as the function of thermal resistance and thermal capacity of the circuit to be verified.

According to a fourth aspect of the invention, a simulation apparatus for circuit verification further comprises functional descriptive data storing means for storing functional descriptive data expressing the model as a combination of function blocks, input test signal storing means for storing input test signals suited to the model, signal name storing means for storing signal identifiers and signal values in the circuit to be verified expressing action modes of the function blocks, and current consumption storing means for storing current consumption data expressing the current consumption of the function blocks in each of the action modes, wherein the simulation executing means builds up the model on the computer on the basis of the functional descriptive data stored in the functional descriptive data storing means, and executes logic simulation of the circuit to be verified at function block level by feeding the input test signals stored in the input test signal storing means equivalently to the model, the circuit action extracting means extracts the action modes of the function blocks by extracting signals corresponding to the identifiers and signal values stored in the signal name storing means, in the process of the logic simulation executed by the simulation executing means, and the total current consumption calculating means calculates the total current consumption on the basis of the action modes extracted by the circuit action extracting means and the current consumption data stored in the current consumption storing means, and saves the total current consumption calculated.

In the apparatus of the fourth aspect of the invention, the temperature can be evaluated by executing logic simulation at function block level which is one of useful techniques of simulation for circuit verification. Moreover, since the total current consumption is calculated on the basis of the current consumption data given in each action mode of function blocks, the total current consumption can be calculated easily and promptly as the basis for calculating the temperature.

Preferably in the fourth aspect of the invention, the input test signals express input signals necessary for determining the action of the function blocks in time series along the flow of simulation time as the virtual time for specifying the mimic action of the circuit to be verified, and repeating in every simulation time when the input signals changing, the simulation executing means executes the logic simulation by feeding the input test signal equivalently to the model, the circuit action extracting means extracts the action modes, and the total current consumption calculating means calculates and saves the total current consumption.

According to a fifth aspect of the invention, a simulation apparatus for circuit verification further comprises circuit connection data storing means for storing circuit connection data expressing the model as a combination of logic gate elements, input test signal storing means for storing input test signals suited to the model, signal name storing means for storing identifiers of output signals of the logic gate elements, and current consumption data storing means for storing current consumption data expressing current consumption of the logic gate elements. wherein the simulation executing means builds up the model on the computer on the basis of the circuit connection data stored in the circuit connection data storing means, and executes logic simulation of the circuit to be verified at logic gate element level, by feeding the input test signals stored in the input test signal storing means equivalently to the model, the circuit action extracting means extracts output signals corresponding to the identifiers stored in the signal name storing means, in the process of the logic simulation executed by the simulation executing means, and the total current consumption calculating means calculates the total current consumption on the basis of the output signals extracted by the circuit action extracting means and the current consumption data stored in the current consumption storing means, and saves the total current consumption calculated.

In the apparatus of the fifth aspect of the invention, the temperature can be also evaluated by executing logic simulation at logic gate element level which is another useful technique of simulation for circuit verification. Moreover, since the total current consumption is calculated on the basis of the current consumption data given in the logic gate element unit, so that the total current consumption can be easily and promptly as the basis for calculating the temperature.

Preferably in the fifth aspect of the invention, the input test signals express input signals necessary for determining the action of the logic gate elements in time series along the flow of simulation time as the virtual time for specifying the mimic action of the circuit to be verified, and repeating in every simulation time when the input signals changing, the simulation executing means executes the logic simulation by feeding the input test signal equivalently to the model, the circuit action extracting means extracts the output signals, and the total current consumption calculating means calculates and saves the total current consumption.

More preferably in the fifth aspect of the invention, the simulation executing means executes the logic simulation in consideration of delay time of the logic gate elements, the circuit action extracting means extracts the output signals in consideration of the delay time, and the total current consumption calculating means calculates the total current consumption in consideration of the delay time and saves the total current consumption calculated.

According to a sixth aspect of the invention, a simulation apparatus for circuit verification further comprises current consumption calculating means for calculating current consumption of the logic gate elements to obtain the current consumption data, and storing the current consumption data in the current consumption data storing means.

In the apparatus of the sixth aspect of the invention, since the current consumption data of the logic gate elements is created by the current consumption calculating means, the labor for preparing the current consumption data is saved.

According to a seventh aspect of the invention, a simulation apparatus for circuit verification further comprises circuit connection data storing means for storing circuit connection data expressing the model as a combination of transistor elements, input test signal storing means for storing input test signals suited to the model, and signal name storing means for storing identifiers of principal electrodes of the transistor elements, wherein the simulation executing means builds up the model on the computer on the basis of the circuit connection data stored in the circuit connection data storing means, and executes circuit simulation of the circuit to be verified, by feeding the input test signals stored in the input test signal storing means equivalently to the model, the circuit action extracting means extracts current signals flowing in principal electrodes corresponding to the identifiers stored in the signal name storing means, in the process of the circuit simulation executed by the simulation executing means, and the total current consumption calculating means calculates the total current consumption on the basis of the current signals extracted by the circuit action extracting means and saves the total current consumption calculated.

In the apparatus of the seventh aspect of the invention, the temperature is evaluated by executing circuit simulation which is one more useful technique of simulation for circuit verification. Since the circuit simulation is employed, the temperature is evaluated strictly.

Preferably in the seventh aspect of the invention, the input test signals express input signals necessary for determining the action of the transistor elements in time series along the flow of simulation time as the virtual time for specifying the mimic action of the circuit to be verified, and repeating in every simulation time advancing at narrower time intervals than the period of flow of transient current in the transistor elements, the simulation executing means executes the circuit simulation by feeding the input test signal equivalently to the model, the circuit action extracting means extracts the current signals, and the total current consumption calculating means calculates and saves the total current consumption.

It is therefore an object of the present invention to provide a simulation apparatus for circuit verification capable of evaluating the temperature of the circuit to be verified.

These and other objects, features, aspects and advantages of the present invention will become more apparent from the following description of the present invention when taken in conjunction with the accompanying drawings.

BRIEF DESCRIPTION OF THE DRAWINGS

FIG. 4 is a timing chart for explaining the operation of the apparatus of the first preferred embodiment;

DESCRIPTION OF THE PREFERRED EMBODIMENTS

First Preferred Embodiment

The apparatus and operation of a first preferred embodiment are described below.

<1.1 Structure of Apparatus>

Figure 1:
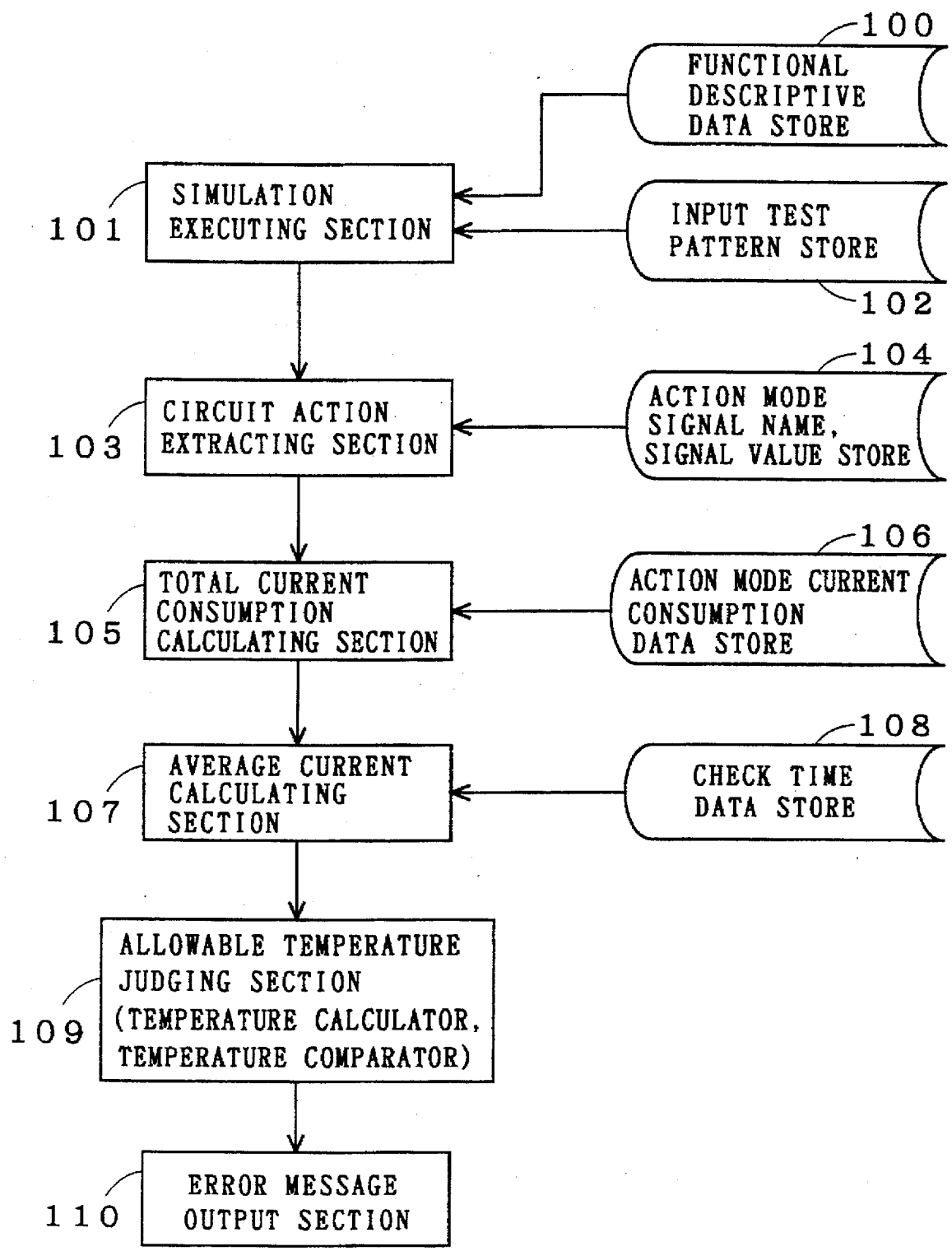
FIG. 1 is a block diagram showing a constitution of an apparatus of a first preferred embodiment.

FIG. 1 is a block diagram showing the structure of the simulation apparatus for circuit verification according to the first preferred embodiment. This apparatus is intended to verify a digital circuit, by simulating its action at function block level, and judging if the temperature of the circuit may exceed an allowable temperature or not.

In FIG. 1, in a functional descriptive data store 100, information about structure of the circuit to be verified in the structural units of function blocks, that is, the functional descriptive data is stored beforehand. The functional descriptive data describes the function of each function block which composes the circuit to be verified, and their connection state. A simulation executing section 101 builds up a model of the circuit to be verified expressed by the functional descriptive data on a computer, and executes functional simulation on the circuit to be verified by operating the model on the computer on the basis of the input test pattern signal stored in an input test pattern store 102.

A function block is a circuit block possessing a specific logic operation function, and, for example, an assembly of logic gate elements, an ALU (arithmetic logic operation unit), a counter, a memory element, or a microprocessor may be defined as one function block. Logic simulation of the circuit to be verified composed in the units of such function blocks is particularly called functional simulation.

In the function block, the operation can be classified into types called action modes. For example, in the ALU, depending on the types of its operational actions, multiplication mode, addition mode, increment mode, and the like are defined. The current consumption may be evaluated in the action mode unit. By evaluating the current consumption in the action mode unit, the time and labor required for calculation of total current described below can be saved.

In an action mode signal name, signal value store 104, identifiers of signals (signal names) expressing the action mode of each function block for composing the circuit to be verified, and their values (signal values) are stored. A circuit action extracting section 103 extracts the action mode of the function block in action on the basis of the signal name and signal value stored in the action mode signal name, signal name store 104, in the process of execution of functional simulation by the simulation executing section 101.

In an action mode current consumption data store 106, information about current consumption in each function block for composing the circuit to be verified and in each action mode is stored. A total current consumption calculating section 105 calculates the current consumption in function block in action corresponding to the action mode extracted by the circuit action extracting section 103, on the basis of the information about the current consumption in each function block stored in the action mode current consumption data store 106, and also calculates the total current consumption, or the sum of the current consumption over the entire circuit to be verified. The calculated value of total current consumption is saved together with the previously calculated total current consumption. That is, in the total current consumption calculating section 105, the information about the history of total current consumption is saved.

In a check time data store 108, the check time of the circuit to be verified is stored. The temperature rise of the circuit to be verified can be evaluated by the magnitude of the heat loss accumulated for a specific period related with thermal characteristics such as thermal resistance and thermal capacity of the circuit to be verified as mentioned above. This period is the check time. That is, the check time reflects the thermal characteristics of the circuit to be verified, and depends on the structure of the semiconductor chip in which the circuit to be verified is developed and its package. To determine the check time, considering these structures, for example, simulation relating to thermal action may be executed. Or, by approximately calculating the thermal resistance and thermal capacity, the value simply multiplying their product by a specific constant may be given as an approximate value.

Meanwhile, the stores 100, 102, 104, 106, and 108 are memory media, such as magnetic disks and semiconductor memories, in which information is stored in a format of magnetic signals, electric signals, or the like.

An average current calculating section 107 calculates the average current on the basis of the history of total current consumption saved in the total current consumption calculating section 105 and the check time stored in the check time data store 108. That is, the average of the total current consumption in the period from the present time back to the check time before is calculated as the average current.

An allowable temperature judging section 109 calculates the temperature of the circuit to be verified on the basis of the thermal resistance of the circuit to be verified, supply voltage, ambient temperature, and the average current calculated in the average current calculating section 107, and judges if this temperature is within the allowable temperature or not. In other words, the average current calculating section 107 comprises a temperature calculator for calculating the temperature, and a temperature comparator for comparing the calculated temperature with the allowable temperature. The value of the allowable temperature is preliminarily provided in the allowable temperature judging section 109. The allowable temperature is defined as the upper limit temperature capable of guaranteeing the normal action of the circuit elements for composing the circuit to be verified, and when the function blocks are composed of, for example, MOS transistors, it is given as the upper limit value of the temperature capable of turning off sufficiently by a specific voltage signal.

An error message output section 110 issues an error message to a CRT or list when the temperature of the circuit to be verified exceeds the allowable temperature on the basis of the result judged by the allowable temperature judging section 109. The error message includes information such as identifier of the function block in action, its action mode, and total current consumption.

The simulation executing section 101 advances the functional simulation step by step on the basis of the input test pattern signal. When the present time is the simulation end time designated before, the simulation executing section 101 terminates the simulation. On the other hand, when the present simulation time is before the simulation end time, the functional simulation is advanced to the time of onset of next signal value change (event), that is, to the next simulation time. In this way, the operation of functional simulation and the accompanying judgement of allowable temperature is advanced step by step.

<1.2 Operation of Apparatus>

Figure 2:
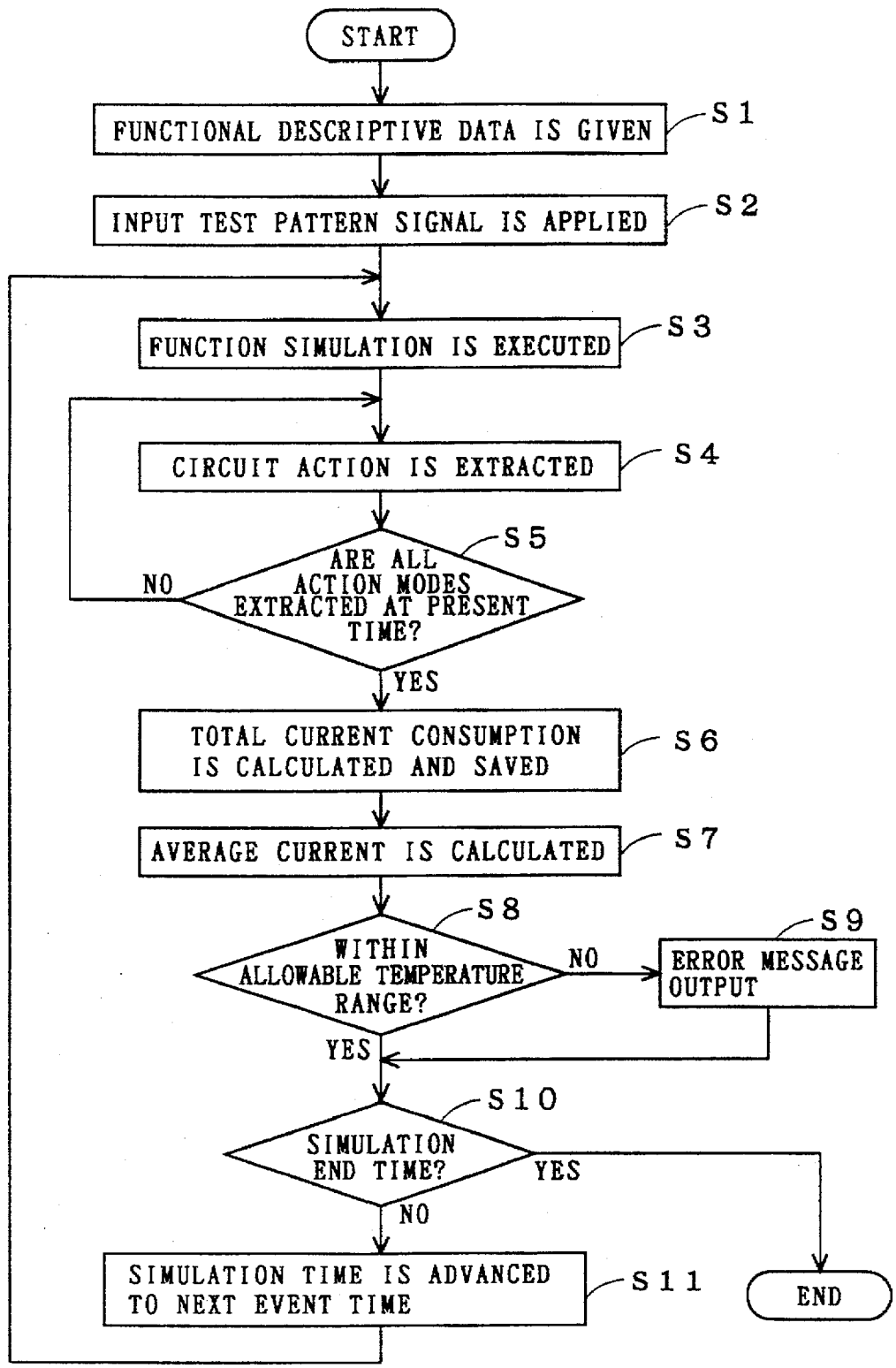
FIG. 2 is a flow chart showing an operation of the apparatus of the first preferred embodiment.
Figure 3:
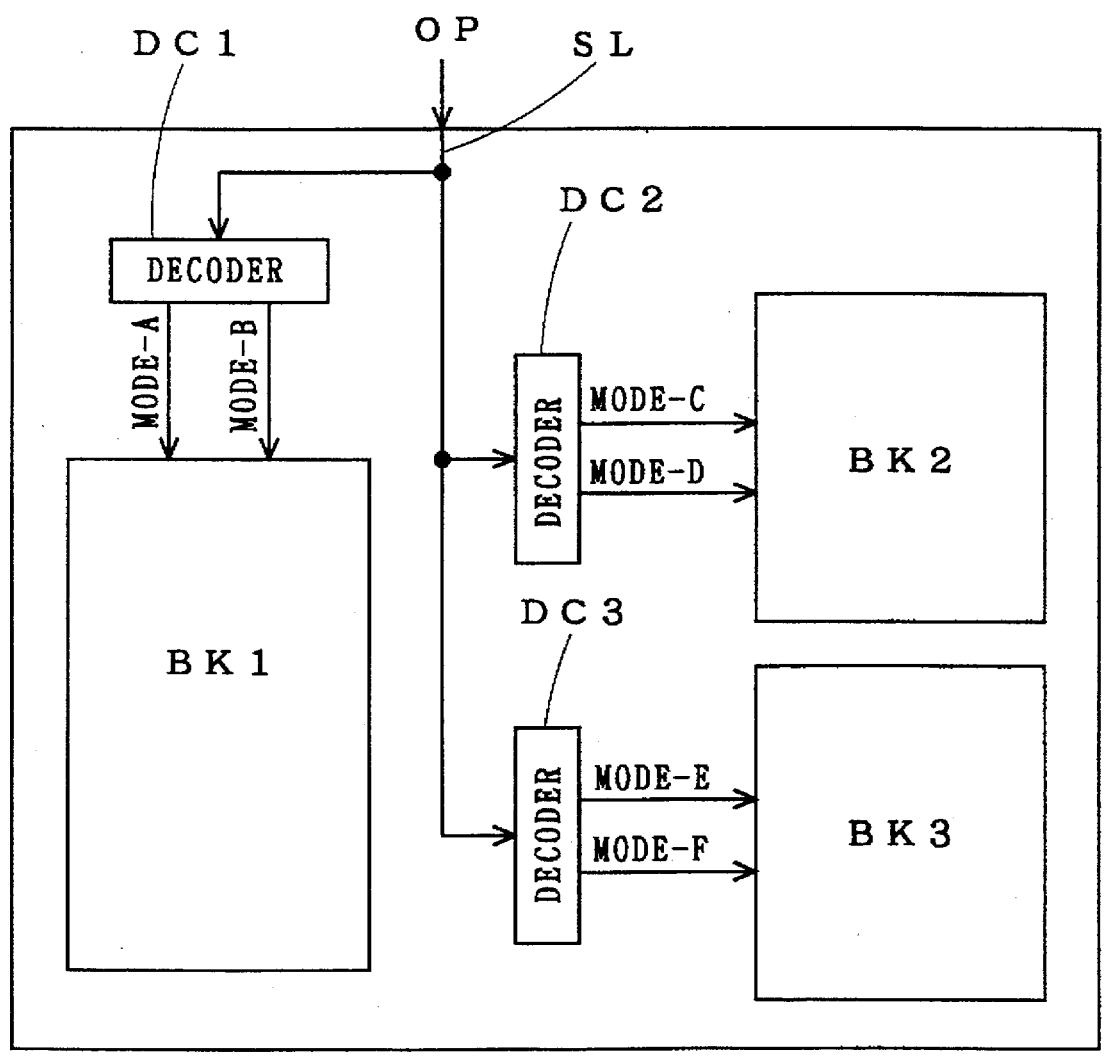
FIG. 3 is a block diagram showing an example of a circuit to be verified by the apparatus of the first preferred embodiment.

FIG. 2 is a flow chart showing the operation of the apparatus shown in FIG. 1. FIG. 3 is a block diagram showing an example of the circuit to be verified by this apparatus.

The circuit to be verified shown in FIG. 3 comprises three function blocks BK1, BK2, BK3, and accompanying decoders DC1, DC2, DC3. In this circuit to be verified, operation code OP is supplied from outside. The operation code is a signal for determining the action mode of the function blocks BK1, BK2, BK3. This operation code is transmitted to the decoders DC1, DC2, DC3 through signal line SL. These decoders DC1, DC2, DC3 decode the signal of the operation code OP, and transmits it to the function blocks BK1, BK2, BK3.

The function block BK1 has two action modes A, B. When the action of the function block BK1 is in mode A, the current consumption is 100 mA, and when in mode B, it is 220 mA. Similarly, the function block BK2 has two action modes C, D, and the current consumption is 90 mA in mode C and 300 mA in mode D. The function block BK3 also has two action modes E, F, and the current consumption is 200 mA in mode E, and 500 mA in mode F.

In FIG. 2, and while referring also to FIG. 3, the operation of the apparatus in FIG. 1 is described below.

Prior to starting of the process in FIG. 2, specific information is stored in the stores 100, 102, 104, 106, and 108. That is, in the functional descriptive data store 100, the functional descriptive data relating to the circuit in FIG. 3 is stored. In the input test pattern store 102, the test patterns of input signals (input test pattern signals) to be fed in the circuit to be verified in FIG. 3 are stored. The input test pattern signals express the values of all input signals necessary for determining the action of each function block including operation code OP in time series. That is, the input test pattern signals define the time-course changes of input signals.

In the action mode signal name, signal value store 104, identifiers and signal values of operation codes OP in FIG. 3 are stored. In the action mode current consumption data store 106, values of current consumption of each mode of function blocks BK1, BK2, BK3 are stored. For example, as for the function block BK1, 100 mA and 220 mA are stored respectively as the current consumption in modes A and B. In the check time data store 108, for example, 1000 nsec is stored as the check time suited to the circuit in FIG. 3.

After the preparation above, execution of the process according to the flow chart in FIG. 2 is started. Once the process in FIG. 3 is started, at step S1, the functional descriptive data is given to the simulation executing section 101.

Next, at step S2, the input test pattern signal is applied to the simulation executing section 101.

At step S3, the functional simulation is carried out by the simulation executing section 101. As a result of functional simulation, at this simulation time, it is assumed that only the function block BK1 is active, and that the action mode is A.

Next, at step S4, extraction by the circuit action extracting section 103, that is, extraction of action mode of the function block in action is done. In the succeeding step S5, it is judged whether all function blocks in action are extracted or not, and if not complete, returning to step S4, extraction is continued. In this way, all function blocks in action are extracted, and the action mode is identified. In the above assumption, therefore, it is identified that only the function block BK1 is extracted and that the action mode is A.

Advancing to step S6, the total current consumption $I_t$ is calculated by the total current consumption calculating section 105. As a result, from the information stored in the action mode current consumption data store 106, the current consumption 100 mA in mode A of the only one function block BK1 in action is read out, and the total current consumption $I_t$ is calculated and saved as 100 mA.

At step S7, the average current is calculated in the average current calculating section 107. At this time, reference is made to the check time stored in the check time data store 108. At the present simulation time, after simulation start time, it is not passed 1000 nsec corresponding to the check time, and hence the average current is calculated as zero.

At step S8, the allowable temperature judging section 109 judges. That is, the allowable temperature judging section 109 executes judgement according to the formula (1): $\{T_a + \theta \times I_{av} \times V_{cc} \leq T_{max}\}$, where $T_a$ is ambient temperature, $\theta$ is thermal resistance of the circuit to be verified, $I_{av}$ is average current calculated in the average current calculating section 107, $V_{cc}$ is the supply voltage of the circuit to be verified, and $T_{max}$ is the allowable temperature. In the thermal resistance $\theta$, the package accompanying the circuit to be verified and others are also taken into consideration.

The left side of formula (1) corresponds to the temperature of the circuit to be verified. Therefore, if the formula (1) is satisfied, the temperature of the circuit to be verified is judged to be less than the allowable temperature, and if not satisfied, to the contrary, it is judged to exceed the allowable temperature. When the temperature of the circuit to be verified is judged to exceed the allowable temperature, the process moves to step S9, and an error message issued by the error message output section 110. At the present simulation time, since the average current $I_{av}$ is zero, the process advances to step S10 without executing step S9.

At step S10, the present simulation time is judged to be whether the specified simulation end time or after or not, and the process is over when the result of judgement is the former case. If the result of judgement is the latter case, the process moves to step S11, and the simulation time is advanced one step to the next changing time of the input test pattern signal, that is, the onset time of the next signal change (event). Afterwards, the process after step S3 is repeated.

For example, when the simulation end time is set at 2000 nsec, the present simulation time is before the simulation end time, and hence the process returns to step S3. At the next simulation time, a series of process after step S3 is executed.

In this way, until reaching the simulation end time, the simulation time is advanced step by step and a series of process is executed repeatedly. This process is explained according to FIG. 4. FIG. 4 is a timing chart showing the action of parts of the circuit to be verified when simulation is executed in the apparatus shown in FIG. 1 on the circuit to be verified shown in FIG. 3. FIG. 4 illustrates changes of the action modes, total current consumption $I_t$ and average current $I_{av}$ of function blocks BK1, BK2, BK3 along the flow of the time.

At the first simulation time of 100 nsec, the function block in action is function block BK1 only as mentioned above, and its action mode is A.

At the next simulation time of 200 nsec, the function blocks BK1 and BK3 are active, and their action modes are A and E. As a result, the total current consumption $I_t$ is 100 mA+200 mA=300 mA. Thereafter, in the same procedure, the total current consumption $I_t$ is calculated at every simulation time.

For example, when the simulation time is 1000 nsec, the function blocks in action are BK1 and BK2, and their action modes are B and D, respectively. Hence, the current consumption is 220 mA+300 mA=520 mA. Herein, since the simulation time is more than the check time of 1000 nsec, the average current $I_{av}$ is calculated. The average current $I_{av}$ of the total current consumption in the period from the moment of 0 nsec till 1000 nsec is calculated as 186 mA.

At the next simulation time of 1100 nsec, only the function block BK1 is active, and its action mode is B. Therefore, the total current consumption is 220 mA. The average current $I_{av}$ is calculated as the average of the total current consumption in the period from 100 nsec to 1100 nsec, and the value is 238 mA. By this average current $I_{av}$ (=238 mA), if the left side of formula (1), that is, then temperature of the circuit in FIG. 3 exceeds the allowable temperature $T_{max}$, an error message is issued from the error message output section 110 at this simulation time.

In FIG. 4, an example of onset of any change in action mode at every simulation time is shown, but generally, change in action mode does not always occur at every simulation time. At a certain simulation time, there may be no change in action mode in any one of the function blocks BK1, BK2, BK3, and the operation is in progress in specific action mode. Even at such simulation time, calculation of average time and judgement of allowable temperature are executed similarly.

This apparatus operates in this manner, and the temperature during action of the circuit to be verified may be evaluated on the computer before assembling the actual device. Still more, during execution of function simulation which is one of the useful techniques of simulation for circuit verification, the temperature can be evaluated. Another advantage is that the total current consumption is calculated efficiently because the logic simulation is executed at function block level and the current consumption is given in the unit of the action mode unit.

Moreover, since the temperature which depends on the history of the total current consumption is calculated by using the average current or the average of the total current consumption over the check time, the temperature is calculated easily and promptly. Furthermore, being provided with the allowable temperature judging section 109 and error message output section 110, it can be directly recognized whether the temperature in action exceeds the allowable temperature or not.

<Second Preferred Embodiment>

The constitution and operation of the apparatus in a second preferred embodiment are explained below.

<2.1 Structure of Apparatus>

Figure 5:
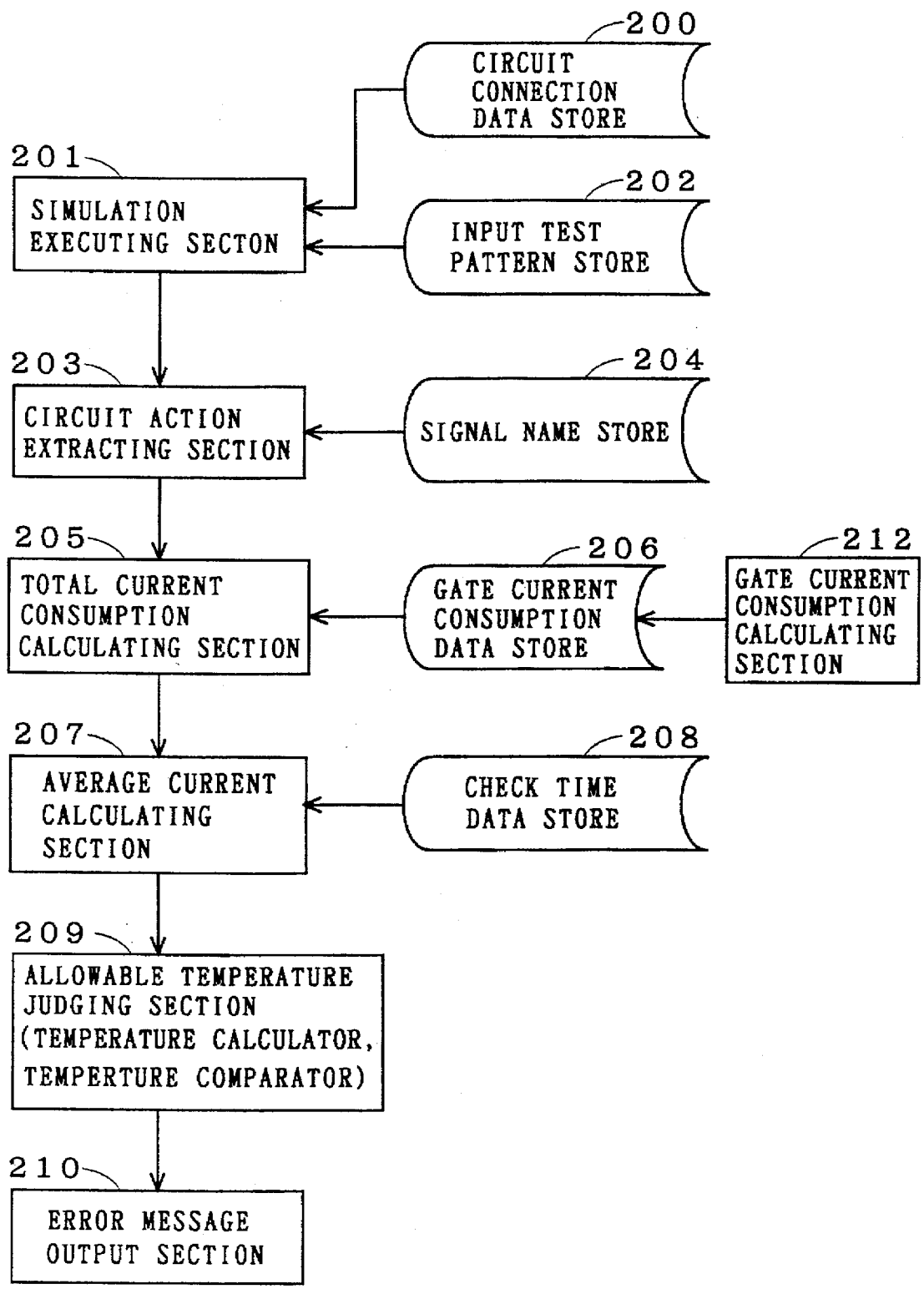
FIG. 5 is a block diagram showing a constitution of an apparatus of a second preferred embodiment.

FIG. 5 is a block diagram showing the structure of the simulation apparatus for circuit verification in the second preferred embodiment. This apparatus is intended to verify a digital circuit, by simulating its action at logic gate element level, and verifying if the temperature of the circuit to be verified exceeds the allowable temperature or not.

In FIG. 5, in a circuit connection data store 200, information about the structure of the circuit to be verified composed of structural units of logic gate elements, that is, the circuit connection data is stored in advance. The circuit connection data describes the types of the logic gate elements composing the circuit to be verified, and their connection state. A simulation executing section 201 builds up a model of the circuit to be verified expressed by the circuit connection data on a computer, and executes the logic simulation at the logic gate element level relative to the circuit to be verified, by operating the model on the computer according to the input test pattern signals stored in an input test pattern store 202.

In a signal name store 204, output signal names of logic gate elements for composing the circuit to be verified are stored. A circuit action extracting section 203 extracts the signal value of the output signal corresponding to each output signal name stored in the signal name store 204 in the process of execution of logic simulation by the simulation executing section 201.

In a gate current consumption data store 206, information about current consumption in every logic gate element for composing the circuit to be verified is stored. this information is calculated in a gate current consumption calculating section 212, and is stored in the gate current consumption data store 206. The gate current consumption calculating section 212 calculates the current consumption during actin of each logic gate element by executing, for example, circuit simulation.

A total current consumption calculating section 205 calculates the current consumption of each logic gate element corresponding to the signal value extracted by the circuit action extracting section 203 on the basis of the information about the current consumption of each logic gate element stored in the gate current consumption data store 206, and also calculates the total current consumption, that is, the sum of the current consumption over the entire circuit to be verified. The calculated value of total current consumption is stored together with the previously calculated value of total current consumption. That is, in the total current consumption calculating section 205, the information about the history of total current consumption is saved.

In a check time data store 208, the check time of the circuit to be verified is stored. The value of the check time may be determined, same as in the first preferred embodiment, by executing simulation about thermal action. Incidentally, the stores 200, 202, 204, 206, and 208 are memory media, such as magnetic disks and semiconductor memories, and the information is stored in a format of magnetic signals, electric signals, or the like.

An average current calculating section 207 calculates the average current on the basis of the history of the total current consumption saved in the total current consumption calculating section 205 and the check time stored in the check time data store 208. That is, the average of the total current consumption in the period from the present time back to the check time before is calculated as the average current.

An allowable temperature judging section 209 calculates the temperature of the circuit to be verified on the basis of the thermal resistance of the circuit to be verified, supply voltage, ambient temperature, and the average current calculated in the average current calculating section 207, and judges if the temperature settles within the allowable temperature or not. That is, same as the allowable temperature judging section 109 in the first preferred embodiment, the average current calculating section 209 comprises a temperature calculator for calculating the temperature, and a temperature comparator for comparing the calculated temperature with the allowable temperature. The value of the allowable current is preliminarily given in the allowable temperature judging section 209. The allowable temperature is defined as the upper limit temperature capable of guaranteeing normal action of the circuit elements for composing the circuit to be verified, and for example when the logic gate elements are composed of MOS transistors, it is given as the upper limit value of the temperature capable of sufficiently turning off by a specific voltage signal.

An error message output section 210 issues an error message to the CRT or list when the temperature of the circuit to be verified exceeds the allowable temperature according to the result judged by the allowable temperature judging section 209. The error message includes information such as identifier of logic gate element in action, its current consumption, and total current consumption.

The simulation executing section 201 advances logic simulation step by step according to the input test pattern signal. The simulation executing section 201 terminates the simulation when the present simulation time is the simulation end time designated before. On the other hand, when the present simulation time is before the simulation end time, the logic simulation is advanced to the onset time of next signal value change (event), that is, the next simulation time. In this way, the logic simulation and accompanying judgement of allowable temperature and the like are advanced step by step.

<2.2 Operation of Apparatus>

Figure 6:
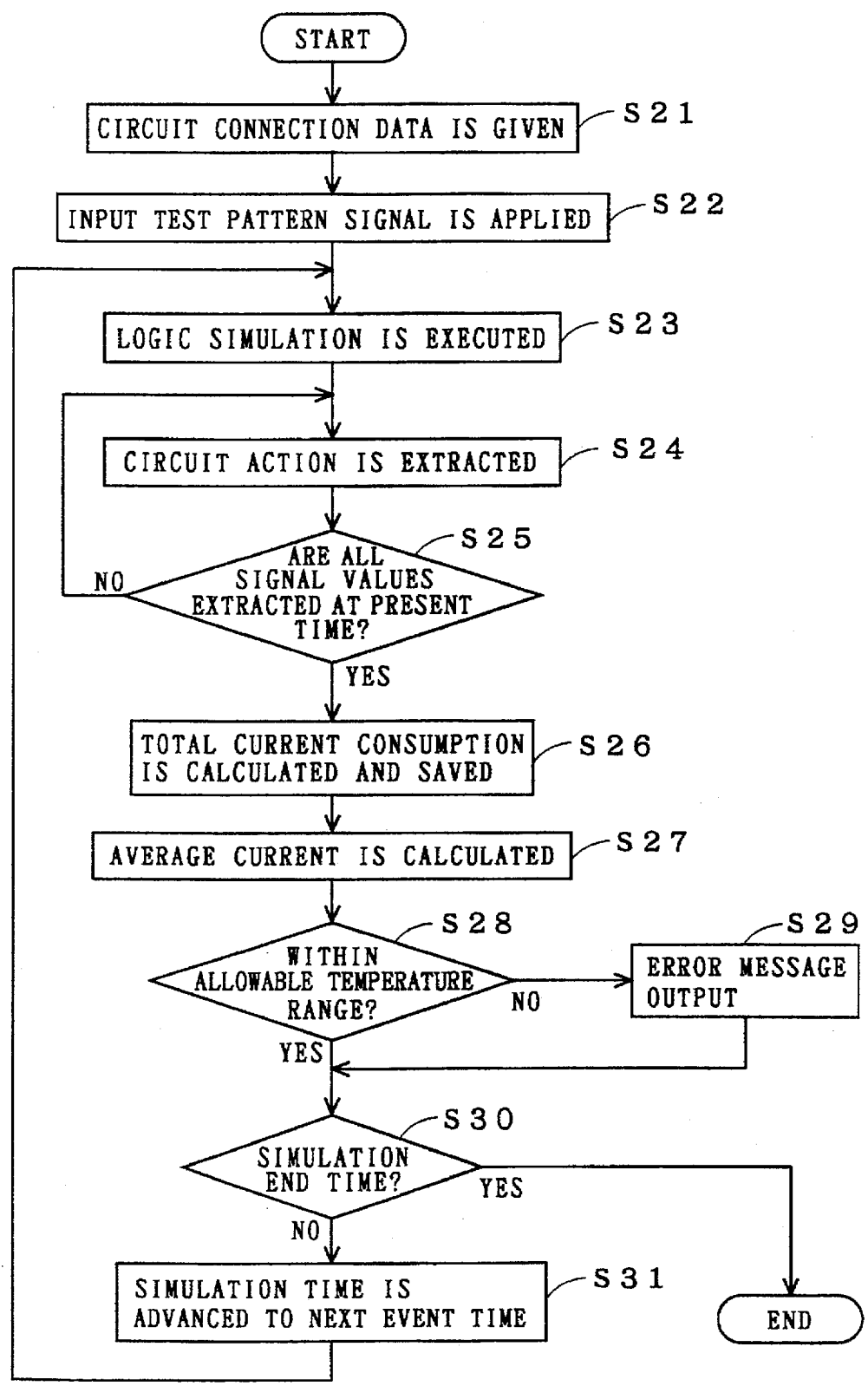
FIG. 6 is a flow chart showing an operation of the apparatus of the second preferred embodiment.
Figure 7A:
FIG. 7 is a timing chart for explaining the operation of the apparatus of the second preferred embodiment.
Figure 7B:
Figure 7C:
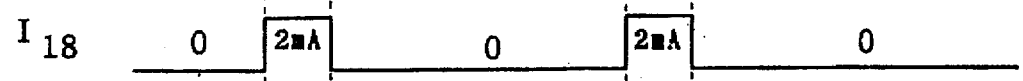
Figure 7D:
Figure 7E:
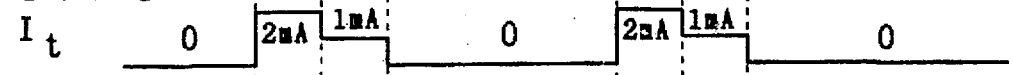
Figure 7F:
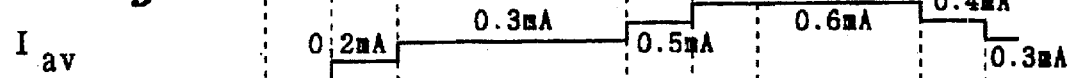
Figure 7G:
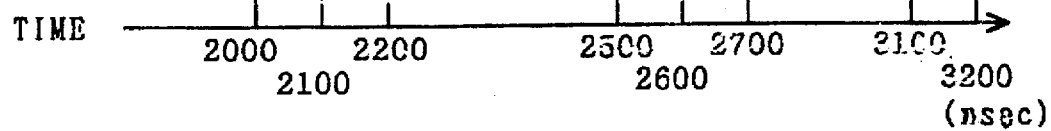

FIG. 6 is a flow chart showing the operation of the apparatus shown in FIG. 5. Referring to an example of the circuit to be verified shown in the circuit diagram in FIG. 13, the operation of the apparatus in FIG. 5 is described along the flow chart in FIG. 6.

Prior to starting of processing in FIG. 6, specified information is stored in the stores 200, 202, 204, 206, and 208. In the circuit connection data store 200, the circuit connection data about the circuit in FIG. 13, that is, the information about NAND gate element 18, inverter gate element 19, and their connection state is stored.

Figure 13:
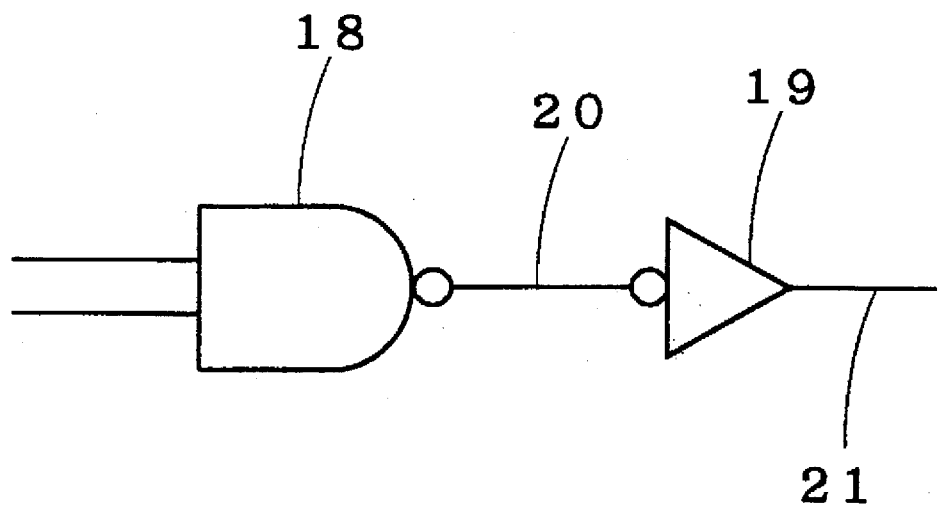
FIG. 13 is a circuit diagram showing an example of a circuit to be verified by the apparatus of the second preferred embodiment and by the conventional apparatus.

In the input test pattern store 202, the test patterns of the input signals to be fed into the circuit to be verified in FIG. 13 are stored. The input test pattern signals express the values of all input signals necessary for determining the action of each logic gate element, that is, the values of input signals to be fed into the input wire of the NAND gate element 18, in time series.

In the signal name store 204, signal names corresponding to output wires 20 and 21 are stored. The gate current consumption calculating section 212 calculates the current consumption of the NAND gate element 18 and inverter gate element 19 due to action, and stores in the gate current consumption data store 206. In the check time data store 208, for example, 1000 nsec is stored as the check time suited to the circuit in FIG. 13.

After the above preparation, execution of the process along the flow chart in FIG. 6 is started. First, at step S21, the circuit connection data is given to the simulation executing section 201.

At step S22, an input test pattern signal is applied to the simulation executing section 201.

At step S23, logic simulation is executed by the simulation executing section 201. As a result of logic simulation, at this simulation time, it is assumed that the signal value of the output wire 20 is changed from "L" to "H." Accordingly, considering the delay time in the inverter gate element 19, change of the signal value of the output wire 21 from "H" to "L" is indicated by simulation. Thus, the simulation executing section 201 executes logic simulation in consideration of the delay time. As the delay time of each logic gate element, for example, it is assumed that 100 nsec is provided.

Next, at step S24, extraction is conducted by the circuit action extracting section 203. That is, signal values of output wire 20 and output wire 21 are extracted. Herein, it is assumed that the NAND gate element 18 and inverter gate element 19 are composed of CMOS transistors. At this time, in particular, the change of signal value in the output wires 20 and 21 is extracted only. At the present simulation time, the output wire 20 changes from signal value "L" to signal value "H," and this change is extracted, and the accompanying change of the output wire 21 from signal value "H" to signal value "L" is extracted.

At step S25, it is judged if extraction of all output signal values is over or not, and if not complete, returning to step S24, extraction is continued. In this way, changes of all signal values in both output wires 220 and 21 are extracted completely.

The process advances to step S26, and the total current consumption $I_t$ is calculated by the total current consumption calculating section 205. As a result, from the information stored in the gate current consumption data store 206, the current consumption 2 mA and 1 mA in the NAND gate element 18 and inverter gate element 19 in action are read out, and the total current consumption $I_t$ is calculated. The total current consumption $I_t$ is calculated in consideration of the delay time.

Next, at step S27, the average current is calculated by the average current calculating section 207. At this time, reference is made to the check time stored in the check time data store 208.

At step S28, judgement is made by the allowable temperature judging section 209. The allowable temperature judging section 209 executes judgement according to the formula (1) mentioned in the first preferred embodiment. When the formula (1) is satisfied, the temperature of the circuit to be verified is judged to be lower than the allowable temperature, and when not satisfied, to the contrary, it is judged to exceed the allowable temperature. When the temperature of the circuit to be verified is judged to exceed the allowable temperature, processing advances to step S29, and an error message is issued by the error message output section 210. When the temperature of the circuit to be verified is judged to be within allowable temperature, processing goes to step S30, skipping step S29.

At step S30, it is judged whether the present simulation time is specified simulation end time or later or not, and the processing is over when the result of judgement is the former case. When the result of judgement is the latter case, processing advances to step S31, and the simulation time is advanced a step to the time of next change of input test pattern signal, that is, to the onset time of the next signal change (event). Afterwards, process of step S23 and later is repeated.

Thus, until reaching the simulation end time, the simulation time is advanced step by step and a series of process is executed repeatedly. This process is explained along FIG. 7.

FIG. 7 is a timing chart showing the action of parts of the circuit to be verified when simulation is executed by the apparatus in FIG. 1 in the circuit to be verified in FIG. 13.

FIG. 7 shows time-course changes of the signal value $V_{20}$ of output signal wire 20, signal value $V_{21}$ of output signal wire 21, current consumption $I_{18}$ of NAND gate element 18, current consumption $I_{19}$ of inverter gate element 19, total current consumption $I_t$, and average current $I_{av}$.

At a certain simulation time 2000 nsec, the signal value $V_{20}$ of the output wire 20 changes from "L" to "H." Along with this change of output signal, current consumption $I_{18}$ of 2 mA flows in the NAND gate element 18 for delay time 100 nsec.

After the delay time 100 nsec, the signal value $V_{21}$ of the output wire 21 changes from "H" to "L." Accordingly, current consumption $I_{19}$ of 1 mA flows in the inverter gate element 19 for delay time 100 nsec. Therefore, the total current consumption $I_t$ is calculated as 2 mA in the period from 2000 nsec to 21000 nsec, and is calculated as 1 mA in the period from 2100 nsec to 2200 nsec.

At simulation time 2000 nsec, since it has already passed the check time of 1000 nsec after start of simulation, the average current $I_{av}$ is calculated. In calculation of average current $I_{av}$, the delay time is considered. Hence, in the period from 2100 nsec to 2200 nsec, as shown in the graph in FIG. 7, the average current $I_{av}$ is calculated as 0.2 mA, and 0.3 mA is calculated in the period from 2200 nsec to 2500 nsec.

At simulation time 2500 nsec, the signal value $V_{20}$ of the output wire 20 changes from "H" to "L." Along with this change of output signal, current consumption $I_{18}$ of 2 mA flows in the NAND gate element 18 for delay time 100 nsec. After the delay time 100 nsec, the signal value $V_{21}$ of the output wire 21 is changed from "L" to "H." Accordingly, in the inverter gate element 19, current consumption $I_{19}$ of 1 mA flows for delay time 100 nsec. Therefore, the total current consumption $I_t$ is calculated as 2 mA in the period from 2500 nsec to 2600 nsec, and is calculated as 1 mA in the period from 2600 nsec to 2700 nsec.

The average current $I_{av}$ is calculated on the basis of the history of the total current consumption It. As a result, the average current $I_{av}$ is calculated as 0.5 mA in the period from 2500 nsec to 2600 nsec as shown in the graph in FIG. 7, and is calculated as 0.6 mA in the period from 2600 nsec to 3100 nsec.

The allowable temperature judging circuit 209 calculates the value of the left side of formula (1) on the basis of the average current $I_{av}$. If the value of the average current $I_{av}$ at which the left side of formula (1), that is, the temperature of the circuit in FIG. 13 coincides with the allowable temperature $T_{max}$, is, for example, 0.55 mA, at time 2600 nsec when the average current $I_{av}$ exceeds 0.55 mA, the temperature of the circuit in FIG. 13 is judged to exceed the allowable temperature $T_{max}$.

This apparatus operates in this manner, and the temperature during action of the circuit to be verified may be evaluated on the computer before assembling the actual machine. Still more, during execution of logic simulation at logic gate element level which is another the useful technique of simulation for circuit verification, the temperature can be evaluated. Another advantage is that the total current consumption is calculated efficiently because the logic simulation is executed at logic gate element level and the current consumption is evaluated in the unit of the logic gate element.

Moreover, since the temperature which depends on the history of the total current consumption is calculated by using the average current or the average of the total current consumption over the check time, the temperature is calculated easily and promptly. Furthermore, being provided with the allowable temperature judging section 209 and error message output section 210, it can be directly recognized whether the temperature in action exceeds the allowable temperature or not.

<Third Preferred Embodiment>

The constitution and operation of the apparatus in a third preferred embodiment are explained below.

<3.1 Structure of Apparatus>

Figure 8:
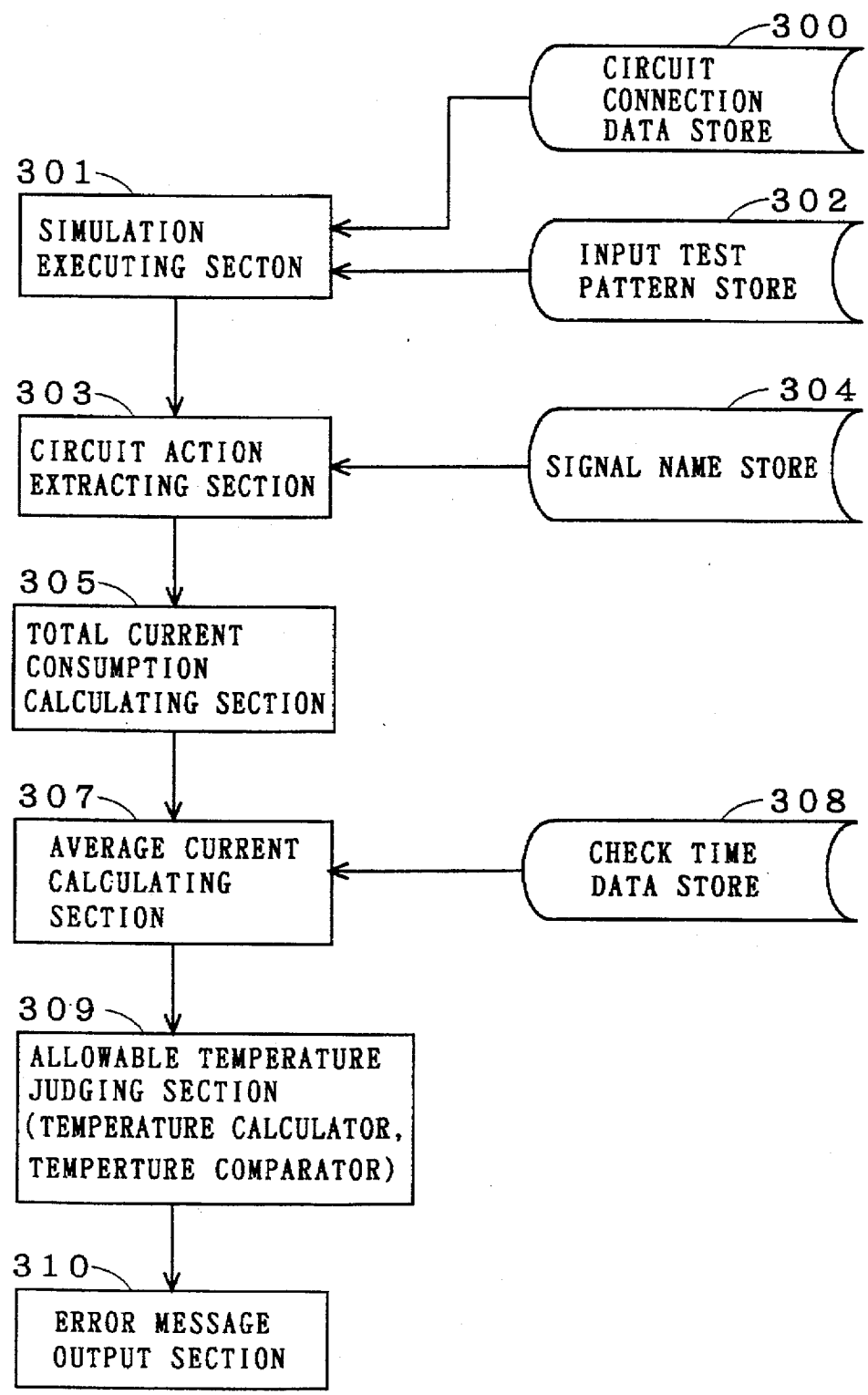
FIG. 8 is a block diagram showing a constitution of an apparatus of a third preferred embodiment.

FIG. 8 is a block diagram showing the structure of a simulation apparatus for circuit verification in the third preferred embodiment. This apparatus can verify not only a digital circuit but also an analog circuit, by simulating the action of the circuit at transistor element level, and verifying if the temperature of the circuit to be verified may exceed the allowable temperature or not.

In FIG. 8, in a circuit connection data store 300, circuit connection data, that is, information about structure of the circuit to be verified composed of transistor element units is stored preliminarily. The circuit connection data describes the structure of transistor elements which composes the circuit to be verified, characteristics, and connection state of the transistor elements. A simulation executing section 301 builds up a model of the circuit to be verified expressed by circuit connection data on a computer, and executes circuit simulation on the circuit to be verified by operating the model on the computer according to the input test pattern signal stored in an input test pattern store 302. In a signal name store 304, identifiers (signal names) of one principal electrode not connected to the power source of transistor elements composing the circuit to be verified, or drain electrodes in MOS transistors, are stored. A circuit action extracting section 303 extracts the current value flowing in the principal electrode corresponding to the signal name stored in the signal name store 304 in the process of execution of circuit simulation by the simulation executing section 301.

A total current consumption calculating section 305 calculates the total current consumption or the sum of the current consumption over the entire circuit to be verified, according to the current value extracted by the circuit action extracting section 303. The calculated value of the total current consumption is saved together with the previously calculated value of total current consumption. That is, in the total current consumption calculating section 305, the information about the history of total current consumption is saved.

In a check time data store 308, the check time of the circuit to be verified is stored. The value of the check time is determined, same as in the first preferred embodiment, by executing simulation about, for example, thermal action. These stores 300, 302, 304, and 308 are memory media such as magnetic disks and semiconductor memories, and the information is stored in a form of magnetic signals, electric signals, or the like.

An average current calculating section 307 calculates the average current on the basis of the history of the total current consumption saved in the total current consumption calculating section 305 and the check time stored in the check time data store 308. That is, the average of the total current consumption in the period from the present time back to the check time before is calculated as the average current.

An allowable current judging section 309 calculates the temperature of the circuit to be verified according to the thermal resistance of the circuit to be verified, supply voltage, ambient temperature, and the average current calculated by the average current calculating section 307, and judges if this temperature settles within the allowable temperature or not. That is, the average current calculating section 309 also comprises, same as the allowable temperature judging section 109, a temperature calculator for calculating the temperature and a temperature comparator for comparing the calculated temperature with the allowable temperature.

The value of the allowable temperature is preliminarily given to the allowable temperature judging section 309. The allowable temperature is defined as the upper limit temperature capable of guaranteeing normal action of the circuit elements composing the circuit to be verified. For example, when the transistor elements for composing the circuit to be verified are MOS transistors, the allowable temperature is given as the upper limit value of the temperature capable of sufficiently turning off by the specific voltage signal.

An error message output unit 310 issues an error message to the CRT or list when the temperature of the circuit to be verified exceeds the allowable temperature on the basis of the result judged by the allowable temperature judging section 309. The error message includes information such as the identifier of the transistor element in action, its principal current value, and total current consumption.

The simulation executing section 301 advances circuit simulation step by step on the basis of the input test pattern. When the present simulation time is the simulation end time designated before, the simulation executing section 301 terminates the simulation. On the other hand, when the present simulation time is before the simulation end time, the circuit simulation is advanced to next simulation time. In this way, the circuit simulation and the accompanying judgement of allowable temperature are advanced step by step.

<3.2 Operation of Apparatus>

Figure 9:
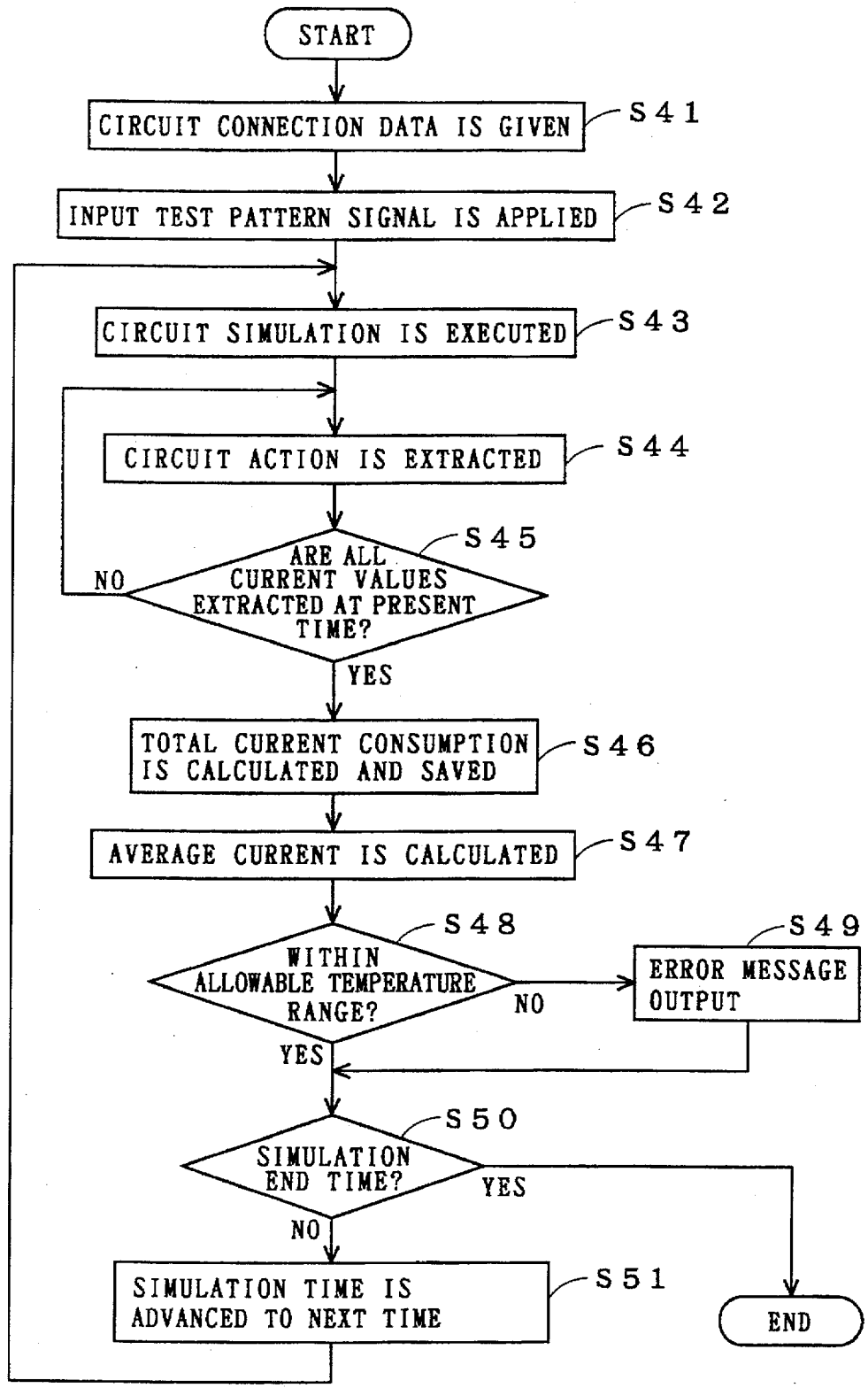
FIG. 9 is a flow chart showing an operation of the apparatus of the third preferred embodiment.
Figure 10:
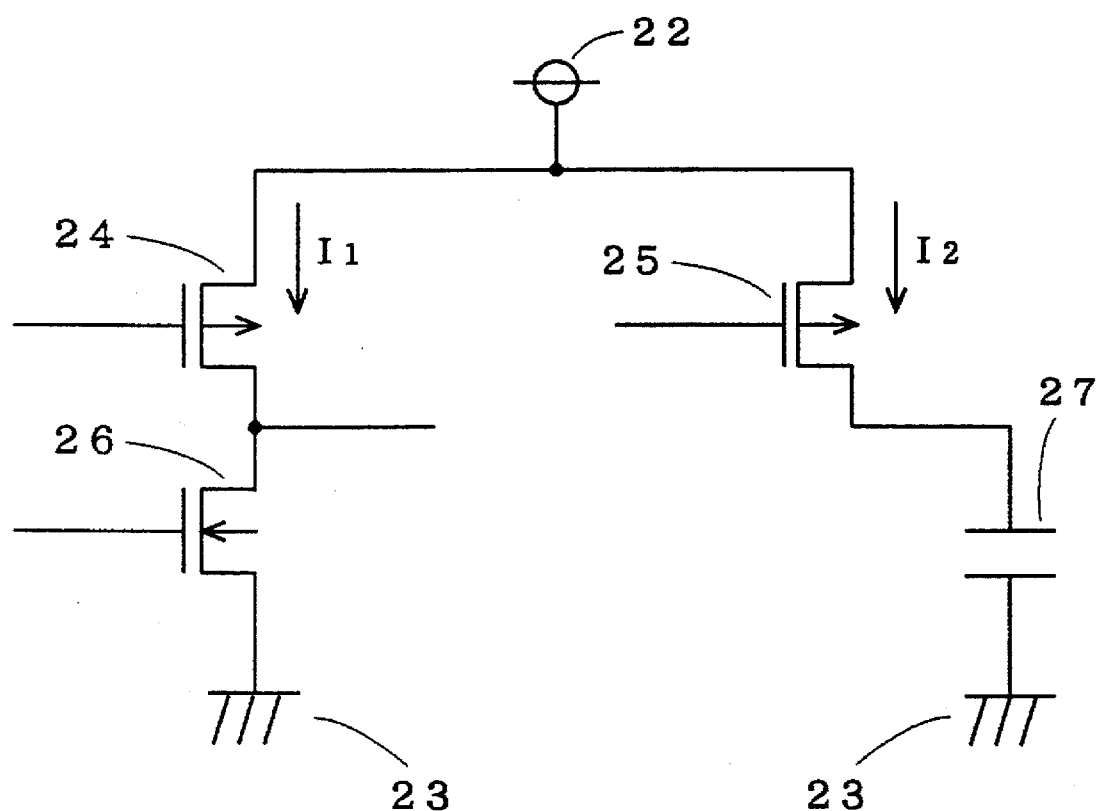
FIG. 10 is a block diagram showing an example of a circuit to be verified by the apparatus of the third preferred embodiment.
Figure 11A:
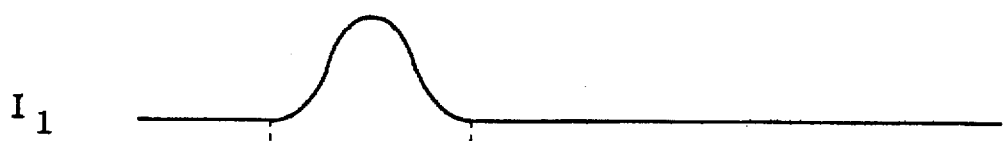
FIG. 11 is a timing chart for explaining the operation of the apparatus of the third preferred embodiment.
Figure 11B:
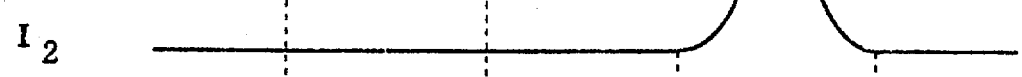
Figure 11C:
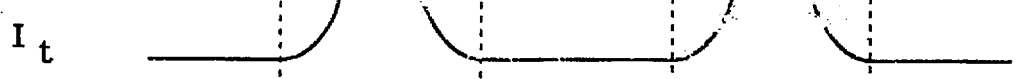
Figure 11D:
Figure 11E:
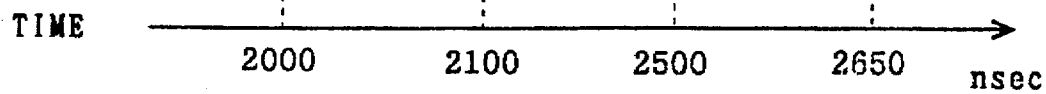
Figure 12:
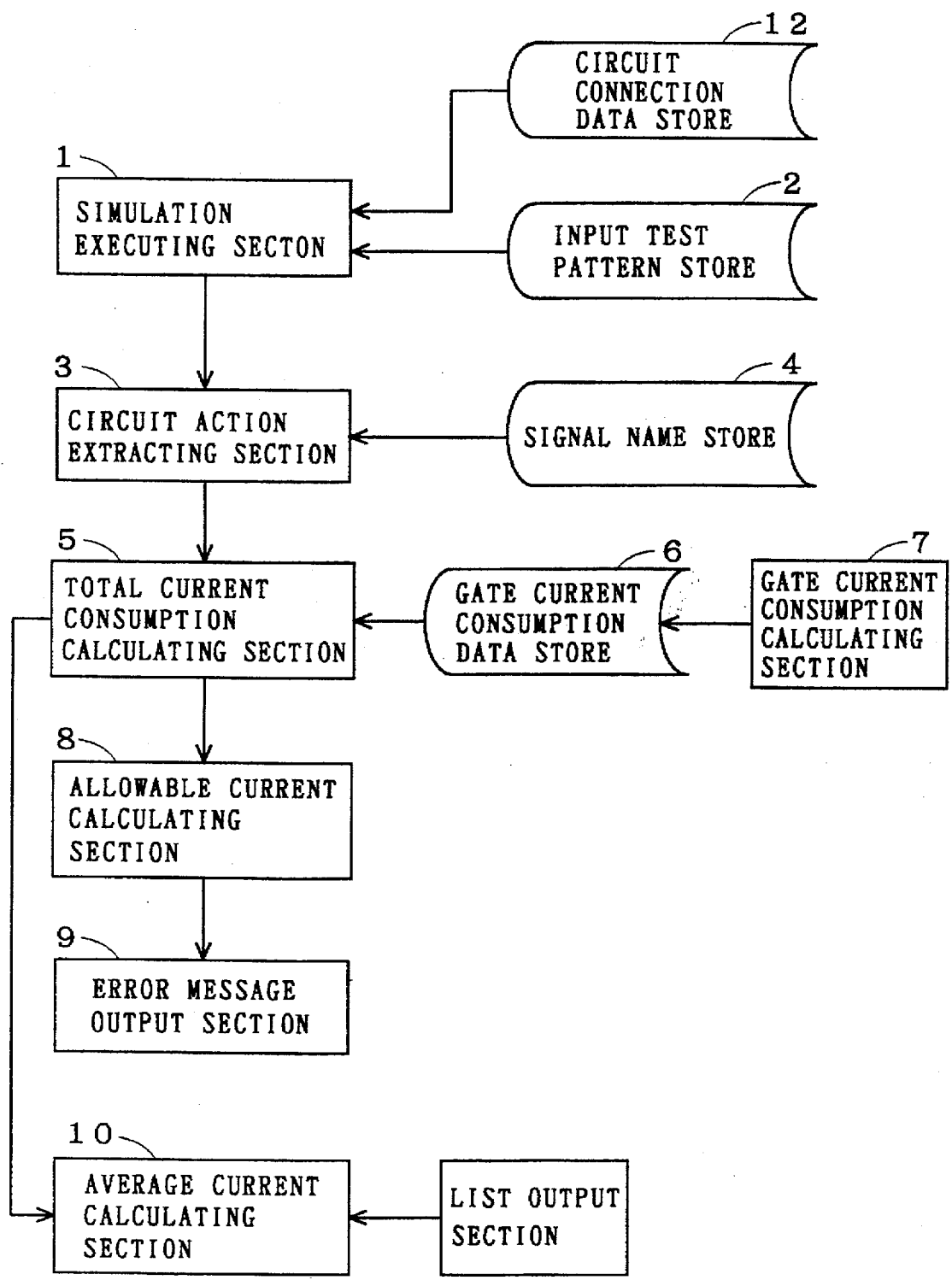
FIG. 12 is a block diagram showing a constitution of a conventional apparatus.

FIG. 9 is a flow chart showing the action of the apparatus shown in FIG. 8. FIG. 10 is a circuit block diagram showing an example of the circuit to be verified by this apparatus. Referring to the example of the circuit to be verified in FIG. 10, the operation of the apparatus in FIG. 8 is explained according to the flow chart in FIG. 9.

First, prior to starting of processing in FIG. 9, specified information is stored in the stores 300, 302, 304, and 308. In the circuit connection data store 300, circuit connection data relating to the circuit in FIG. 10 is stored, that is, the information about PMOS transistors 24, 25, NMOS transistor 26, capacitor 27, high voltage side power source 23, grounding side power source 23, and their connection state.

In the input test pattern store 203, test patterns of input signals to be fed into the circuit to be verified in FIG. 10 are stored. The input test pattern signals express the values of all input signals necessary for determining the action of each MOS transistor, that is, values of gate voltage to be fed to gate electrodes of the MOS transistors 24, 25, 26 in FIG. 10, in time series.

Furthermore, in the signal name store 304, signal names for identifying the drain electrodes of MOS transistors 24, 25, 26 are stored. In the check time data store 308, for example, 1000 nsec is stored as the check time suited to the circuit in FIG. 10.

After the above preparation, execution of the process according to the flow chart in FIG. 9 is started. Once the process in FIG. 9 is started, at step S41, the circuit connection data is given to the simulation executing section 301.

At step S42, the input test pattern signal is applied to the simulation executing section 301.

At step S43, circuit simulation by the simulation executing section 301 is executed. As a result, the value of the current flowing in the parts in the circuit in FIG. 10 is calculated.

At step S44, the circuit action extracting section 303 extracts. That is, the value of the current flowing in the drain electrodes of the MOS transistors 24, 25, 26 is extracted.

At step S45, it is judged if all current values are completely extracted or not, and if not complete, returning to step S44, extraction continues. In this way, values of current flowing in the drain electrodes of the MOS transistors 24, 25, 26 are completely extracted.

The process is advanced to step S46, and the total current consumption $I_t$ is calculated by the total current calculating section 305. That is, the total current consumption It is calculated as the sum of the currents $I_1$, $I_2$ flowing in the drain electrodes of the MOS transistors 24, 25 contributing to the current consumption.

At next step S47, the average current is calculated by the average current calculating section 307. At this time, reference is made to the check time stored in the check time data store 308.

At step S48, judgement is made by the allowable temperature judging section 309. The allowable temperature judging section 309 judges according to the formula (1) mentioned in the first preferred embodiment. When the formula (1) is satisfied, the temperature of the circuit to be verified is judged to be lower than the allowable temperature, and if not satisfied, to the contrary, it is judged to exceed the allowable temperature. When the temperature of the circuit to be verified is judged to exceed the allowable temperature, processing is advanced to step S49, and an error message is issued by the error message output section 310. When the temperature of the circuit to be verified is judged to be within the allowable temperature, processing advances to step S50 by skipping step S49.

At step S50, the present simulation time is judged to be whether the specified simulation time or later or not, and the processing is over when the result of judgement is the former case. If the result of judgement is the latter case, the processing advances to step S51, and the simulation time is advanced one step to the next time. Thereafter, the processing at step S43 and later is repeated.

Thus, until reaching the simulation end time, a series of process is repeatedly executed while advancing the simulation time step by step. This process is explained by reference to FIG. 11.

FIG. 11 is a timing chart showing the action of parts of the circuit to be verified, when the circuit to be verified in FIG. 10 is simulated by the apparatus in FIG. 8. FIG. 11 illustrates time-course changes of the currents $I_1$, $I_2$, total current consumption $I_t$, and average current $I_{av}$.

At simulation time 2000 nsec, it is assumed that the gate voltage fed to the gate electrode of the MOS transistor 24, and the gate voltage fed to the gate electrode of the MOS transistor 25 are simultaneously changed from "H" to "L." Along with this change, the current flows transiently into the drain electrodes of the MOS transistors 24, 25. In FIG. 11, the hill-shaped waveform of the current $I_1$ from 2000 nsec to 2100 nsec expresses the transient current flowing in the MOS transistor element 24. Circuit simulation enables to reproduce the waveform of such transient current on the computer, by advancing the simulation time at a shorter time interval than the flowing period of transient current (about 100 nsec in the example in FIG. 11), while considering the structure and characteristics of the MOS transistor elements 24, 25, 26.

At other simulation time 2500 nsec, it is assumed the gate voltage fed to the gate electrode of the MOS transistor element 24 is changed from "H" to "L." Accordingly, the current for charging the capacitor 27 flows transiently in the drain electrode of the MOS transistor element 25. In FIG. 11, the hill-shaped waveform of the current $I_2$ from 2500 nsec to 2650 nsec expresses the transient current flowing in the MOS transistor element 25.

As the sum of these currents $I_1$, $I_2$, the total current consumption $I_t$ is calculated. Therefore, the total current consumption $I_t$ has a finite value in both periods of 2000 nsec to 2100 nsec, and 2500 nsec to 2650 nsec, as shown in FIG. 11. The average current $I_{av}$ is calculated as the average of the total current consumption $I_t$ in the period corresponding to the check time (1000 nsec in this example) at each simulation time. Therefore, the average current $I_{av}$, as shown in FIG. 11, after increasing in the period from 2000 nsec to 2100 nsec, holds a specific value. The average current $I_{av}$ further increases in the period from 2500 nsec to 2650 nsec, and holds a specific value. Although omitted in FIG. 11, the average current $I_{av}$ decreases after 3000 nsec.

Along with elevation of the average current $I_{av}$, the temperature of the circuit to be verified evaluated in the left side of formula (1) is assumed to exceed the allowable temperature $T_{max}$, at a certain simulation time in the period of 2500 nsec to 2650 nsec. Hence, at this simulation time, an error message is issued from the error message output section 210.

The apparatus thus operates, and therefore the temperature of the circuit to be verified in action can be evaluated on the computer before assembling the actual device. It is moreover possible to evaluate the temperature while executing the circuit simulation which is a further different useful technique of simulation for circuit verification. Owing to the circuit simulation, still more advantageously, the structure of the circuit to be verified is not particularly limited, and the precision of temperature is precise.

In addition, since the temperature depending on the history of the total current consumption is calculated by using the average current which is the average of the total current consumption over the check period, the temperature is detected easily and promptly. Yet, having the allowable temperature judging section 309 and error message output section 310, it is possible to recognize directly whether the temperature in action may exceed the allowable temperature or not.

<Other Preferred Embodiments>

(1) In the foregoing preferred embodiments, all of the allowable temperature judging sections 102, 209 and 309 comprise the temperature calculator for calculating the temperature, and the temperature comparator for comparing the calculated temperature with allowable temperature. Instead, the allowable temperature judging section may comprise only the temperature calculator only to calculate the temperature of the circuit to be verified. If the simulation apparatus for circuit verification is thus constructed, the information about the temperature of the circuit to be verified is obtained, and therefore, for example, by comparing this temperature with the allowable temperature, it is possible to judge if the temperature of the circuit to be verified in action may exceed the allowable temperature or not.

(2) In the simulation apparatus for circuit verification in the foregoing preferred embodiments, the average current is calculated on the basis of the history of the total current consumption, and the temperature of the circuit to be verified is calculated on the basis of the calculated average current. However, the temperature of the circuit to be verified depending on the history of the total current consumption may be calculated without using the average current. For example, on the basis of the history of the total current consumption, the temperature can be also calculated by executing the past time integration of the total current consumption by using a proper weighting function depending on the thermal characteristic of the circuit to be verified.

While the invention has been shown and described in detail, the foregoing description is in all aspects illustrative and not restrictive. It is therefore understood that numerous modifications and variations can be devised without departing from the scope of the invention.

I claim:

1. A simulation apparatus for circuit verification comprising:

simulation executing means for building a model equivalent to a circuit to be verified on a computer, operating said model on the computer by feeding an input test signal to be fed in said circuit to be verified equivalently to said model on the computer, and thereby simulating an action of said circuit to be verified;

circuit action extracting means for extracting a signal relating with current consumption of each part of said circuit to be verified by mimiking the action of said parts of said circuit robe verified by said simulation executing means;

total current consumption calculating means for calculating and saving a total current consumption as a sum of respective current consumption for said parts over the circuit to be verified based on which of said parts consume current according to the signal extracted by said circuit action extracting circuit; and temperature calculating means for calculating a temperature of said circuit based on a history of total current consumption saved in said total current consumption calculating means, where said history includes said sum of respective current consumption for said parts.

2. A simulation apparatus for circuit verification of claim 1, further comprising:

temperature comparing means for comparing the temperature of said circuit to be verified calculated by said temperature calculating means with the allowable temperature in said circuit to be verified, and judging if the temperature of said circuit to be verified is below said allowable temperature or not; and output means for issuing the result judged by said temperature comparing means.

3. A simulation apparatus for circuit verification of claim 2, wherein said allowable temperature is determined as an upper limit temperature capable of guaranteeing normal action of circuit elements composing said circuit to be verified.

4. A simulation apparatus for circuit verification of claim 2, wherein said circuit elements are MOS transistors; and said allowable temperature is determined as an upper limit of temperature capable of sufficiently turning off said MOS transistors by a specific gate voltage signal.

5. A simulation apparatus for circuit verification of claim 1, further comprising:

average current calculating means for calculating the average over a specific period of the total current consumption saved in the total current calculating means as average current; wherein said temperature calculating means calculates the temperature of said circuit to be verified as the sum of peripheral temperature of said circuit to be verified and product of said average current, supply voltage applied to said circuit to be verified, and thermal resistances of said circuit to be verified.

6. A simulation apparatus for circuit verification of claim 5 wherein said specific period is determined by executing simulation about thermal behavior of said circuit to be verified.

7. A simulation apparatus for circuit verification of claim 5, wherein said specific period is determined approximately as the function of thermal resistance and thermal capacity of said circuit to be verified.

8. A simulation apparatus for circuit verification of claim 1, further comprising:

functional descriptive data storing means for storing functional descriptive data expressing said model as a combination of function blocks;

input test signal storing means for storing input test signals suited to said model;

signal name storing means for storing signal identifiers and signal values in said circuit to be verified expressing action modes of said function blocks; and current consumption storing means for storing current consumption data expressing the current consumption of said function blocks in each of said action modes; wherein said simulation executing means builds up said model on said computer on the basis of said functional descriptive data stored in said functional descriptive data storing means, and executes logic simulation of said circuit to be verified at function block level by feeding said input test signals stored in said input test signal storing means equivalently to said model;

said circuit action extracting means extracts said action modes of said function blocks by extracting signals corresponding to the identifiers and signal values stored in said signal name storing means, in the process of said logic simulation executed by said simulation executing means; and said total current consumption calculating means calculates said total current consumption on the basis of the action modes extracted by said circuit action extracting means and said current consumption data stored in said current consumption storing means, and saves said total current comsumption calculated.

9. A simulation apparatus for circuit verification of claim 8, wherein said input test signals express input signals necessary for determining the action of said function blocks in time series along the flow of simulation time as the virtual time for specifying the mimic action of said circuit to be verified; and repeating in every simulation time when said input signals changing, said simulation executing means executes said logic simulation by feeding said input test signal equivalently to said model, said circuit action extracting means extracts said action modes, and said total current consumption calculating means calculates and saves said total current consumption.

10. A simulation apparatus for circuit verification of claim 1, further comprising:

circuit connection data storing means for storing circuit connection data expressing said model as a combination of logic gate elements;

input test signal storing means for storing input test signals suited to said model;

signal name storing means for storing identifiers of output signals of said logic gate elements; and current consumption data storing means for storing current consumption data expressing current consumption of said logic gate elements; wherein said simulation executing means builds up said model on said computer on the basis of said circuit connection data stored in said circuit connection data storing means, and executes logic simulation of said circuit to be verified at logic gate element level, by feeding said input test signals stored in said input test signal storing means equivalently to said model;

said circuit action extracting means extracts output signals corresponding to said identifiers stored in said signal name storing means, in the process of said logic simulation executed by said simulation executing means; and said total current consumption calculating means calculates said total current consumption on the basis of said output signals extracted by said circuit action extracting means and said current consumption data stored in the current consumption storing means, and saves said total current consumption calculated.

11. A simulation apparatus for circuit verification of claim 10, wherein said input test signals express input signals necessary for determining the action of said logic gate elements in time series along the flow of simulation time as the virtual time for specifying the mimic action of said circuit to be verified; and repeating in every simulation time when said input signals changing, said simulation executing means executes said logic simulation by feeding said input test signal equivalently to said model, said circuit action extracting means extracts said output signals, and said total current consumption calculating means calculates and saves said total current consumption.

12. A simulation apparatus for circuit verification of claim 11, wherein said simulation executing means executes said logic simulation in consideration of delay time of said logic gate elements;

said circuit action extracting means extracts said output signals in consideration of said delay time; and said total current consumption calculating means calculates and saves said total current consumption in consideration of said delay time and saves said total current consumption calculated.

13. A simulation apparatus for circuit verification of claim 10, further comprising:

current consumption calculating means for calculating current consumption of said logic gate elements to obtain said current consumption data, and storing said current consumption data in said current consumption data storing means.

14. A simulation apparatus for circuit verification of claim 1, further comprising:

circuit connection data storing means for storing circuit connection data expressing said model as a combination of transistor elements;

input test signal storing means for storing input test signals suited to said model; and signal name storing means for storing identifiers of principal electrodes of said transistor elements; wherein said simulation executing means builds up said model on said computer on the basis of said circuit connection data stored in said circuit connection data storing means, and executes circuit simulation of said circuit to be verified, by feeding said input test signals stored in said input test signal storing means equivalently to said model;

said circuit action extracting means extracts current signals flowing in principal electrodes corresponding to said identifiers stored in said signal name storing means, in the process of said circuit simulation executed by said simulation executing means; and said total current consumption calculating means calculates said total current consumption on the basis of said current signals extracted by said circuit action extracting means and saves said total current consumption calculated.

15. A simulation apparatus for circuit verification of claim 14, wherein said input test signals express input signals necessary for determining the action of said transistor elements in time series along the flow of simulation time as the virtual time for specifying the mimic action of said circuit to be verified; and repeating in every simulation time advancing at narrower time intervals than the period of flow of transient current in said transistor elements, said simulation executing means executes said circuit simulation by feeding said input test signal equivalently to said model, said circuit action extracting means extracts said current signals, and said total current consumption calculating means calculates and saves said total current consumption.

* * * * *